United States Patent
Hausman, Jr. et al.

(10) Patent No.: US 6,347,028 B1
(45) Date of Patent: Feb. 12, 2002

(54) LOAD CONTROL SYSTEM HAVING AN OVERLOAD PROTECTION CIRCUIT

(75) Inventors: Donald F. Hausman, Jr., Emmaus; Walter Steven Zaharchuk, Macungie; Robert William Lenig, Bethlehem; Stuart DeJonge, Riegelsville, all of PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 0 days.

(21) Appl. No.: 09/337,309

(22) Filed: Jun. 21, 1999

(51) Int. Cl.⁷ .................................................. H02H 3/20
(52) U.S. Cl. ...................... 361/93.1; 361/18; 323/276
(58) Field of Search .............................. 361/18, 78, 79, 361/91.1, 93.1, 93.2; 327/545, 530; 315/194, 199, 291, 307; 323/276, 265, 279, 280, 281–286

(56) References Cited

U.S. PATENT DOCUMENTS

| | | | |
|---|---|---|---|
| 4,429,339 A | 1/1984 | Jaeschke et al. | 361/93 |
| 4,654,568 A | 3/1987 | Mansmann | 318/293 |
| 4,937,697 A | 6/1990 | Edwards et al. | 361/18 |
| 4,955,069 A * | 9/1990 | Ionescu | 361/93 |
| 5,010,293 A | 4/1991 | Ellersick | 323/278 |
| 5,038,081 A | 8/1991 | Maiale, Jr. et al. | 315/291 |
| 5,041,940 A | 8/1991 | Sullivan | 361/18 |
| 5,079,456 A | 1/1992 | Kotowski et al. | 307/571 |
| 5,268,631 A * | 12/1993 | Gorman et al. | 323/246 |
| 5,325,258 A | 6/1994 | Choi et al. | 361/87 |
| 5,333,196 A | 7/1994 | Jakab | 379/413 |
| 5,436,824 A | 7/1995 | Royner et al. | 363/89 |
| 5,444,358 A | 8/1995 | Delepaut | 323/222 |
| 5,510,679 A | 4/1996 | Maiale, Jr. et al. | 315/194 |
| 5,519,310 A | 5/1996 | Barlett | 323/316 |
| 5,867,001 A | 2/1999 | Lagerquist et al. | 318/439 |

FOREIGN PATENT DOCUMENTS

FR  2 733 648  10/1996

OTHER PUBLICATIONS

U.S application No. 08/942,833, Newman, Jr. et al., filed Oct. 2, 1997.

* cited by examiner

Primary Examiner—Kim Huynh
(74) Attorney, Agent, or Firm—Woodcock Washburn Kurtz Mackiewicz & Norris LLP

(57) ABSTRACT

A load control circuit having an overload circuit capable of protecting a switching element from overload conditions over a wide range of operating conditions. The overload circuit limits the maximum average power dissipation of the switching element in accordance with a comparison of an average voltage across the switching element over a half-cycle and a variable threshold. The variable threshold is determined based on an ON-state resistance of the switching element and the environment in which the switching elements are operating. The variable threshold accounts for the squared term ($V^2$ or $I^2$) in determining power dissipation and allows power to be determined based on average voltage.

30 Claims, 9 Drawing Sheets

LOAD CONTROL SYSTEM HAVING AN OVERLOAD PROTECTION CIRCUIT

FIELD OF THE INVENTION

The present invention relates generally to load control systems, and more particularly, to a lighting control system having an overload protection circuit to limit the power dissipation of a switching element in the control system from exceeding a predetermined maximum level.

BACKGROUND OF THE INVENTION

Phase-controlled lighting controllers are well known and perform dimming functions by selectively connecting an AC power source to a load during each half-cycle. The AC power may be switched using controllably conductive devices such as triacs, anti-parallel SCRs, field effect transistors (FETs) or insulated gate bipolar transistors (IGBT). The amount of dimming is determined by the ratio of "ON" time to "OFF" time of the controllably conductive device. In conventional forward phase-controlled dimming, the controllably conductive device (triac or SCR) is OFF at the beginning of each half-cycle (i.e., at the zero crossing) and turned ON later in the half-cycle. In reverse phase-controlled dimming, the controllably conductive device (FET or IGBT) is switched ON to supply power to the load at or near the zero crossing and is switched OFF later during the half-cycle. For each method of phase-controlled dimming, the ratio of ON time to OFF time is determined based on a user-selected desired intensity level.

Lighting controllers are rated to control a predetermined maximum load. If the controller is overloaded the maximum temperature rating of the controllably conductive device may be exceeded and the device will not last as long as a properly loaded device or fail catastrophically rendering the controller useless. A lighting controller can easily be overloaded by an installer who connects too many lamps to the controller or by a maintenance person who replaces failed lamps with higher wattage lamps.

Another factor that may lead to an elevated device temperature is operating the lighting controller in an elevated ambient temperature. Lighting controllers are rated to operate in an ambient temperature range usually 0 to 40° C. An elevated ambient temperature would cause an otherwise properly loaded device to operate above its safe operating temperature.

Several methods of sensing overload conditions may be found in the prior art. For example, U.S. Pat. No. 5,325,258, to Choi et al., discloses a gate driver circuit that uses sense resistors to determine the current flowing through a low side and high side FET. While the FET is being driven (i.e., ON), a voltage across the sense resistor is compared to a fixed threshold voltage. If the voltage across the sense resistor remains above the fixed threshold for a period of time set by a blanking circuit, the FET is determined to be overloaded and shut down. The blanking circuit is provided to prevent spurious signals from shutting down the FET driver. While Choi et al. prevents overload conditions under certain circumstances, it would fail to detect a short circuit condition during the blanking period. Also, because Choi et al. compares the current passing through the FET to a fixed threshold, the device may not accurately detect overcurrent conditions that occur early in the ON period of each half cycle.

U.S. Pat. No. 5,010,293, to Ellersick, discloses a current limiting circuit for a power FET. A bipolar transistor is connected to shunt the gate of the power FET to the potential at its source when the bipolar transistor is conducting in order to limit the current passing through the power FET. A sense resistor is provided in series with a conductor path for controlling a base element of the bipolar transistor to cause the transistor to conduct when current through the sense resistor exceeds a predetermined amount. However, the Ellersick circuit is limited because it compares the current passing through the FET to a fixed threshold, which may not accurately detect overcurrent conditions early in the ON period of each half cycle and because the power FET becomes active to limit the current which dissipates a lot of power.

U.S. Pat. No. 5,079,456, to Kotowski et al., discloses a current monitoring circuit that includes a smaller sense FET that carries a current proportional to a larger power FET in the device. A comparator senses the voltage across the smaller transistor to indicate if the current in the sense transistor exceeds a predetermined amount equal to a maximum source current of the sense transistor. A second embodiment regulates the source current through the sense transistor in order to regulate the current through the power transistor wherein the sense transistor is operating in the linear region. By modifying the drain to source voltage of the sense transistor the device can regulate the current carried by the power transistor. A particular disadvantage of the Kotowski et al. system is that it requires a separate sense FET to monitor the power FET, which adds to the complexity and cost of the monitoring circuit. Again, the FET becomes active to limit the current which dissipates a lot of power.

U.S. Pat. No. 4,937,697, to Edwards et al., discloses another protection circuit that monitors instantaneous FET drain to source voltage to provide a current sense signal. When the current sense signal exceeds a predetermined reference limit signal, a first control circuit turns the FET OFF instantly. A reference generator provides a reference limit signal having a predetermined temperature variation as a function of the sensed temperature of the FET such that current limits may be set for low device temperatures. A second control circuit is provided to protect against overcurrent conditions created by short circuits by turning the FET OFF when sensed FET current exceeds a predetermined limit after a delay. The delay circuit inhibits operation of the control circuits until a predetermined time after the FET is turned ON. During this time there is no protection.

While each of the systems described above attempts to prevent overloading and overheating of the controllably conductive devices for their particular applications, they require the use of more costly hardware or fail to provide adequate protection over a wide range of operating conditions and environments. In addition, the devices of the prior art function to limit the flow of current through the controllably conductive device in overload conditions by modifying the drain to source voltage, which does not reduce the overall power dissipation in the FET. The load control circuit of the present invention reduces the current flow to a safe operating level while not increasing dissipation in the FET. The present invention provides a solution to these problems.

SUMMARY OF THE INVENTION

In accordance with a first aspect of the present invention, there is provided a protection circuit for use in a load control system for limiting power dissipated by an electronic component that switches an AC source to a load. The electronic component may be, e.g., a field effect transistor. The protection circuit includes an integrating circuit which integrates a measured parameter of the electronic component over a predetermined period of time and produces an output value, a threshold generating circuit which generates a first threshold indicative of a maximum average power dissipation of the electronic component, and a comparator circuit which compares the first threshold and the output value. The comparator provides a signal to turn OFF the electronic component when the output value exceeds the first threshold.

In accordance with a feature of the invention, the first threshold may be determined in accordance with an ON-state resistance of the electronic component and the measured parameter. Further, the first threshold may have a variable value that changes during one-half of a period of a fundamental frequency of the AC source. The predetermined period of time may begin when the AC source crosses a zero potential, and have a length no longer than one-half of a period of a fundamental frequency of the AC source.

According to other features of the invention, the protection circuit may include a reset circuit that holds OFF the integrating circuit during a period of time that the electronic component is normally OFF. A filtering circuit may be provided that receives the signal from the comparator circuit to smooth the control of the electronic component in accordance with a time constant of the filtering circuit. The protection circuit may further include an error generating circuit that receives an output of the filtering circuit and compares the output of the filtering circuit to a second threshold. The error generating circuit may turn OFF the electronic component based on the second threshold. The second threshold may vary in accordance with an ON-state resistance of the electronic component and the maximum average power dissipation of the electronic component. Further, the second threshold may be identical to the first threshold.

In accordance with another aspect of the present invention, there is provided a load control system for delivering power from an AC source to a load. The load control system includes a zero cross detector that monitors the AC source having a fundamental frequency, at least one switching element that selectively connects the AC source to the load, a sensing circuit that senses an instantaneous ON-state parameter of the at least one switching element and produces an output, an overload circuit that determines if the at least one switching element is in an overload condition, a short circuit protection circuit that also receives the output to determine if the at least one switching element is shorted, and a controller that controls the load control system.

The controller of the load control system receives information from the zero cross detector and outputs a gate drive signal to turn the at least one switching element ON. Also, the overload circuit receives the output and determines an integrated value of the ON-state parameter and compares the integrated value to a threshold indicative of a maximum average power dissipation of the at least one switching element to make its determination if the switching element is in an overloaded state, and reduces the ON time of the at least one switching element when the at least one switching element is determined to be overloaded. Further, the overload protection circuit may include the features of the above-noted protection circuit. The short circuit protection circuit also reduces the ON time of the at least one switching element when the at least one switching element is determined to be shorted. The OFF-state voltage of the at least one switching element may not be detected to improve accuracy of the overload circuit.

The load control system may be used to control capacitive loads, and in particular may be used to control a lighting load. In such an environment, the controller sets an ON-time of the at least one switching element to a constant duty cycle for a given intensity level of the lighting load set by a user. Further, the overload conditions may be visually indicated to a user by flashing the lighting load.

According to features of the invention, the load control system may also include a power supply that is connected to the AC source and outputs a regulated voltage to the controller. A gate drive circuit may be included that receives an output of the overload circuit and the short circuit protection circuit to turn OFF the at least one switching element. The gate drive circuit turns OFF the at least one switching element based on a predetermined prioritization, wherein the short circuit protection circuit has priority over the overload circuit, and the overload circuit has priority over the controller to turn OFF the at least one switching element.

In accordance with yet another aspect of the present invention, there is provided a method of protecting a switching element connected between an AC source and a load from dissipating power in excess of a predetermined amount. The method comprising measuring a parameter of the switching element; integrating the measured parameter over a predetermined time period to produce an output; comparing the output to a variable threshold; producing a signal when the output exceeds the variable threshold; and turning OFF the switching element in response to the signal. The switching element may comprise a field effect transistor (FET), and the ON-state parameter may be a selected one of a voltage across the FET, a current through the FET, or a temperature of the FET.

According to features of the invention, the switching element may be turned OFF when the instantaneous ON-state parameter exceeds a second threshold value. Further, a visual indication may be provided to a user that the switching element has been overloaded by, e.g., cycling power to the load by turning OFF and ON the switching element.

Additional aspects and features of the present invention are detailed below.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, in which like references numerals represent similar parts throughout the several views of the drawings, it being understood, however, that the invention is not limited to the specific methods and instrumentalities disclosed. In the drawings.

DETAILED DESCRIPTION OF THE PREFERRED EMBODIMENT

Figure 1:
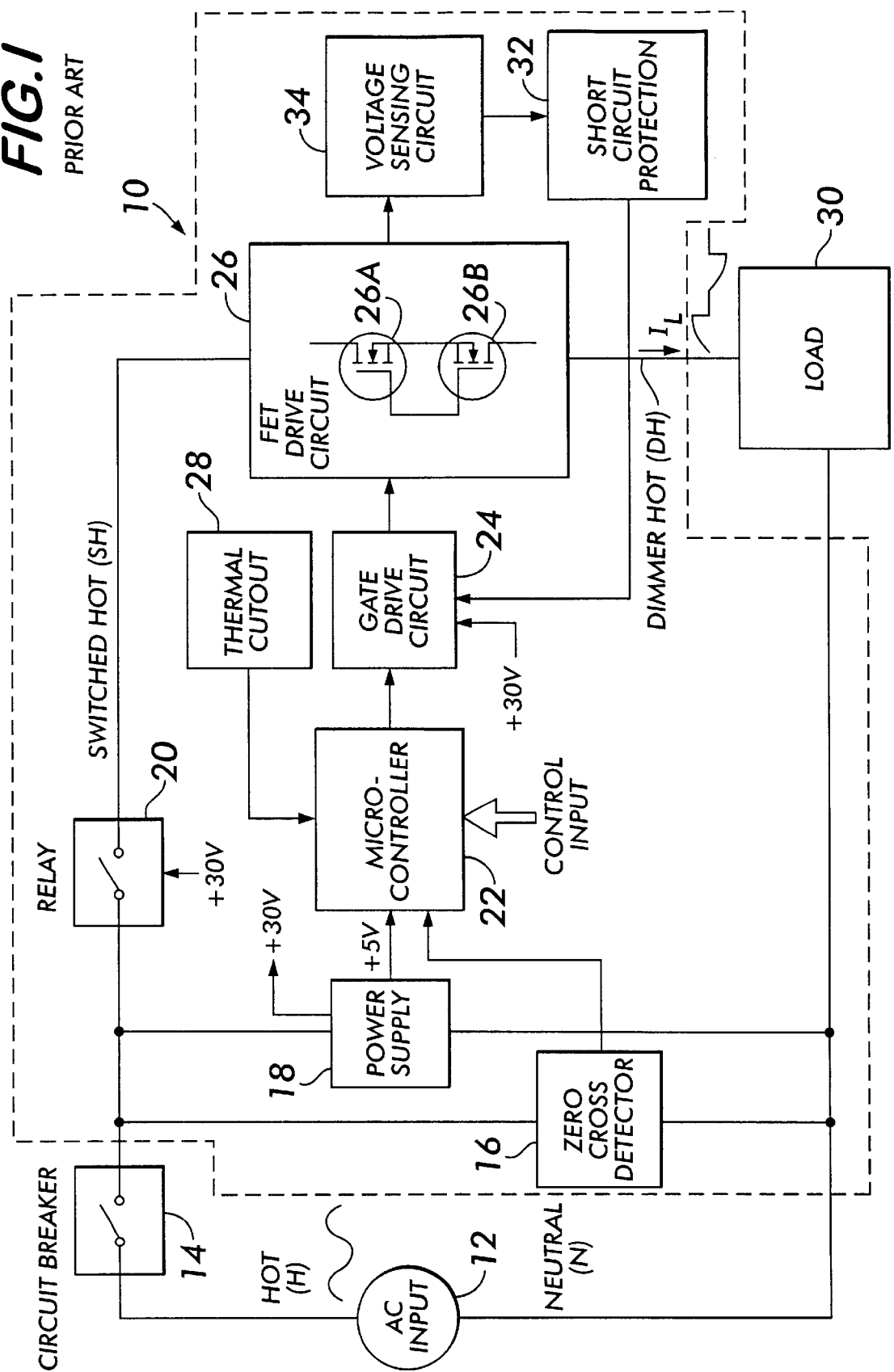
FIG. 1 is a block diagram of a load control circuit according to the prior art.

Referring now to FIG. 1, there is illustrated a block diagram of a prior art 3-wire load control circuit 10 for controlling power to a load 30, such as a lighting load. The load control circuit 10 may be part of an overall dimming system which allows a user to selectively set lighting levels within a room, building, etc. In the load control circuit 10, the load 30 that is being controlled is an electronic low voltage transformer. Because this type of load has a capacitive input, it is typically controlled by a reverse-phase control circuit such as the load control circuit 10. Alternatively, the load 30 may be a resistive load, such as an incandescent lighting load. Examples of a reverse-phase control circuit may be found in U.S. Pat. Nos. 5,038,081 and 5,510,679, both to Maiale, Jr. et al. and commonly assigned to the assignee of the present invention. The disclosures of the aforementioned U.S. Patents are expressly incorporated herein by reference in their entireties. It is noted that magnetic or inductive loads, which require forward-phase control, may not be controlled by the load control circuit 10 as illustrated and described below. However, with modifications to the gate drive circuit it is possible to generate a forward-phase control signal to control these loads. In addition, the load control circuit 10 may be implemented in a 2-wire configuration by connecting the zero cross detector 16 and the power supply 18 reference to the lead marked "DH".

The load control circuit 10 is coupled to an AC input source 12 via a circuit breaker 14, which is provided to disconnect the AC source 12 if the load control circuit 10 draws current in excess of a predetermined maximum line current (e.g., 20 Amps) over a predetermined period of time. The predetermined period of time may be as long as several seconds or more which would prevent its use to protect the load control circuit against short circuits. Further, a single 10A load control circuit 10 may be the only circuit connected to a 20A circuit breaker. The circuit breaker would not trip until the load current exceeded 20A, by this time the 10A load control circuit 10 may have suffered serious damage.

The control circuit 10 includes a zero cross detector 16 that monitors the AC source voltage and outputs a signal when the instantaneous source voltage passes through 0 V in either direction. Because the timing within the load control circuit 10 is based on accurately determining when the AC source voltage passes through 0 V, the zero cross detector 16 may include a Bessel filter to remove unwanted noise from the AC source voltage. The filter allows the zero cross detector 16 to more accurately determine a true zero crossing of the fundamental frequency and also serves to reduce fluctuations in timing within the load control circuit 10. An example of a lighting controller utilizing a Bessel filter to more accurately determine the true zero cross of the AC fundamental frequency may be found in pending U.S. patent application Ser. No. 08/942,833 which is commonly assigned to the assignee of the present invention. The disclosure of which is expressly incorporated by reference in its entirety.

A power supply 18 is provided to supply a regulated voltage (e.g., 30 V) and a logic level voltage (e.g., 5 V) for components internal to the load control circuit 10. The power supply 18 may include a switching device, such as a FET, to charge a supply capacitor, which allows the power supply 18 to be used over a wide range of AC source voltages. The regulated voltage may be supplied to drive a relay 20 or a gate drive circuit 24, whereas the logic level voltage may be supplied to a microcontroller 22 and its associated support circuitry (not shown).

A FET drive circuit 26 includes a pair of FETs 26A/26B arranged in a series configuration with a common source connection to switch the AC input source 12 to the load 30. The gates of both FETs 26A/26B are driven simultaneously by a signal from a gate drive circuit 24, which allows the control circuit 10 to use a voltage from power supply 18 to turn ON the FETs 26A/26B. The FETs 26A/26B have the intrinsic characteristic of being able to conduct a load current $I_L$ of, e.g., 16 A during the ON-state, while also being able to withstand the AC source voltage of the AC source 12 when in the OFF-state. It is noted that FETs are used in the load control circuit 10 because triacs, which are used in standard dimmers, cannot be turned OFF in the middle of the AC half-cycle without complicated control electronics due to triac latching characteristics.

A voltage sensing circuit 34 is provided to measure the instantaneous ON-state voltage of the conducting FET 26A or 26B and outputs a signal indicative of the ON-state voltage of the conducting FET to a short circuit protection circuit 32. The ON-state voltage of the FET is indicative of the load current $I_L$ passing through the FET, and when the FET is operating in a safe region, the ON-state voltage is between approximately 2–4 V. The output signal of the voltage sensing circuit 34 is monitored to prevent a catastrophic failure of the FET should a large current pass therethrough. In particular, the short circuit protection circuit 32 senses if the signal from the voltage sensing circuit 34 has exceed a predetermined level indicative of a short circuit condition. The short circuit protection is designed to be quick acting. If the dimmer is turned on into a short circuit or very large overload, the short circuit protection instantly turns the FETs OFF before any serious damage to the FETs can occur. Because it is not necessary to detect the OFF-state voltage of the FET to determine if there has been a short circuit, the signal from the voltage sensing circuit 34 is blocked when the FETs are in the OFF-state. The signal is also blocked in the OFF-state because the short circuit protection circuit 32 monitors for a relatively low voltage, therefore, it would be difficult for the short circuit protection circuit 32 to accurately determine a short circuit condition if the OFF-state voltage was passed to the circuit 32, as the OFF-state voltage of the FET 26A or 26B may be as high as 400 V.

A thermal cutout (TCO) 28 is provided to prevent the FETs 26A/26B from reaching an unsafe operating temperature. The TCO 28 is selected so the FETs turn off completely or cut back their power to an a fixed level if the load control circuit is overloaded or operated in an elevated ambient environment. The TCO 28 is selected to protect the FETs 26A/26B in case of a slight overload (up to ~40%) over time. The TCO 28 has a thermal lag which prevents its use to protect against short circuits. Typically, the thermal cutout 28 is a fusible link that opens when heated to completely disconnect the AC input source 12 from the load 30. In the system of FIG. 1, the opening of TCO 28 signals to microcontroller 22 to disconnect load 30 from source 12 or cause it go to an extremely low light level. The thermal cutout 28 must be replaced by the user after opening to re-enable the load control circuit 10. Manual or automatically resettable TCOs can also be used. Proper placement of the TCO 28 is very critical and presents difficulty in manufacturing.

The operation of the load control circuit 10 of FIG. 1 will now be discussed with reference to the operation of the microcontroller 22. The microcontroller 22 receives zero cross information from the zero cross detector 16 and serial data from a SCI link (Control Input) that includes, e.g., information related to a user-selected lighting intensity level. The zero cross information serves as a timing signal for driving the FETs 26A/26B such that they are alternately switched ON and OFF to connect the AC source 12 to the load 30. The microcontroller 22 subtracts a phase shift that maybe created by the filter in the zero cross detector 16 to determine the appropriate timing for control of the FETs 26A/26B. Also, the microcontroller 22 determines a period of time that each FET 26A/26B should be in an ON-state during its respective active half-cycle from the lighting intensity level information in the serial data.

Based on the above inputs, the microcontroller 22 outputs a gate drive signal to the gate drive circuit 24, which in turn, drives FETs 26A/26B ON and OFF. The microcontroller 22 ensures that the conduction time of each FET 26A or 26B creates a constant duty cycle for a selected lighting intensity level. This also ensures that the output lighting level remains constant over a wide range of frequencies of the AC source 12. The power supply 18 for the gate drive circuit 24 is only charged on the negative half-cycle because this is the only half-cycle where a microcontroller common reference and the FET source common reference are the same.

As illustrated in FIG. 1, the gate drive circuit 24 combines the gate drive signal of the microcontroller 22 with the output of a short circuit protection circuit 32. Because of the rapid failure of the FETs that may occur under short-circuit conditions, if the short circuit protection circuit 32 determines that a short circuit may be present, the short circuit protection signal to the gate drive circuit 24 takes priority over the gate drive signal from the microcontroller 22 to immediately turn OFF the FETs 26A/26B. Under a short circuit condition, the gate drive 24 remains OFF until the next zero crossing. At that point the FET drive is reapplied until the short is detected again.

While the load control circuit 10 of FIG. 1 is adequate for most applications, it is limited in that it does not gracefully control non-short circuit overload situations. The load control circuit 10 reacts to non-short circuit overload situations or elevated ambient temperature environments by cutting off the load current $I_L$ via the thermal cutout 28, which must be reset or replaced. This approach is limited because load control circuit 10 is typically located in a location that is either inaccessible or distant from the actual load 30 being controlled. A further limitation is that it may lead to unsafe conditions in the area being illuminated because the lights (load) are turned OFF or to an extremely low level that ensures safe operation in overload conditions leaving an occupant in the dark. Also, the elevated ambient temperature condition may come and go with changing environmental conditions making trouble shooting difficult.

Figure 2:
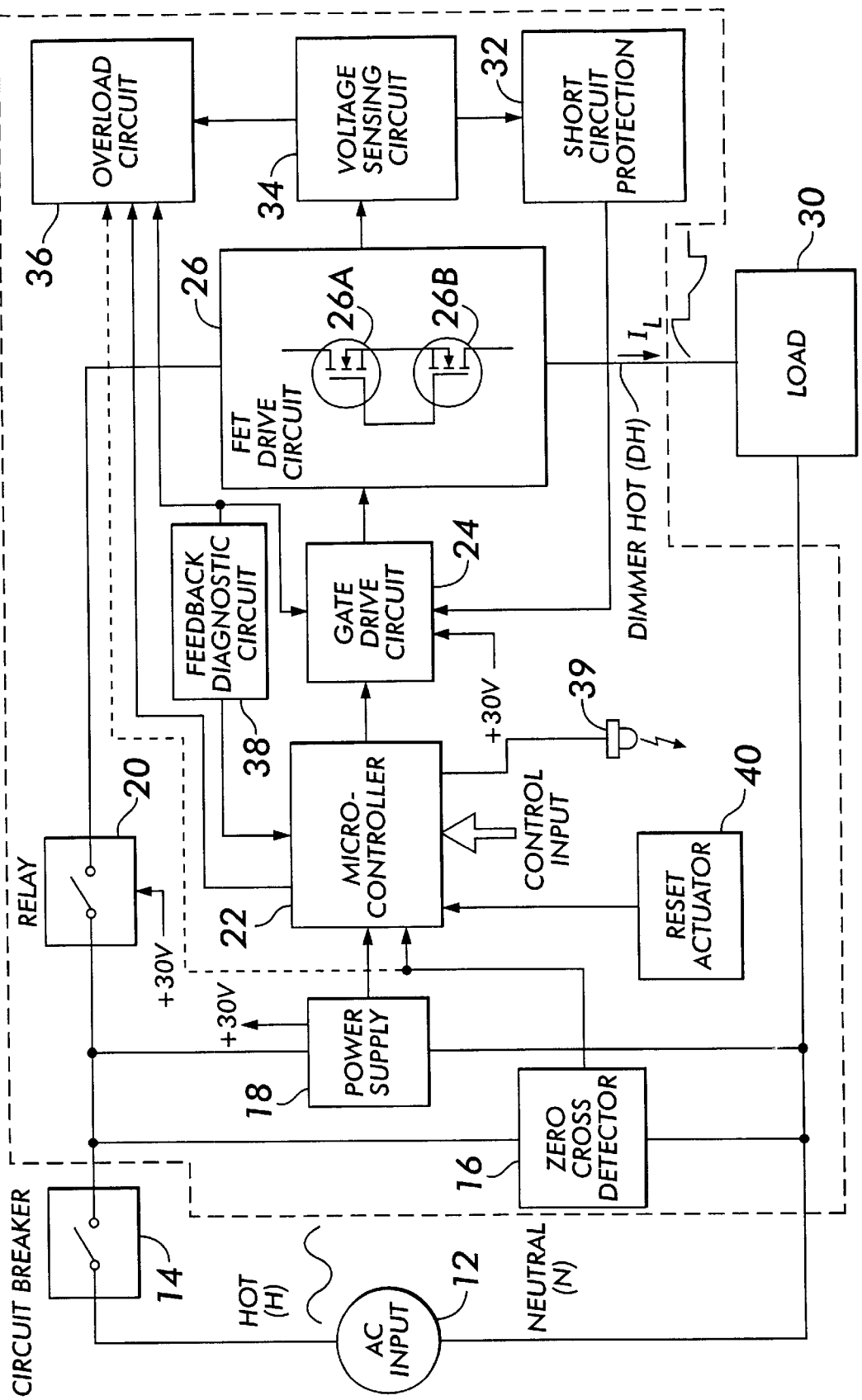
FIG. 2 is a block diagram of a load control circuit having an overload protection circuit according to the present invention.

Referring now to FIG. 2, there is a block diagram of a load control circuit 10' having an overload circuit 36 designed in accordance with the present invention to overcome the limitations of the prior art load control circuit. The present invention improves upon the prior art solution of thermal cutouts by employing an overload protection device that limits the maximum average power dissipation of the FETs to a predetermined level. The overload circuit 36 is designed to react slowly to overloads to reduce the ON-time of an overloaded FET to maintain the load current $I_L$ at a reduced level. In operation, this feature of the present invention advantageously maintains a reduced level of lighting from a level that may be requested by user input and does not completely cut off the lighting as in the prior art.

The components of the load control circuit 10' that are similar to those of FIG. 1 have similar reference numerals and, accordingly, will not be described herein again. As illustrated in FIG. 2, the output of the voltage sensing circuit 34 of the load control circuit 10' is provided to both the short circuit protection circuit 32 and the overload circuit 36. The overload circuit 36 receives the output of the voltage sensing circuit 34 and integrates it over each AC half-cycle to determine an average voltage $V_{AVG}$ across the FET over time. At every zero crossing the overload circuit 36 is reset in accordance with a signal provided by the microcontroller 22. Alternatively, the output of the zero crossing detector 16 may be used to reset the overload circuit 36 (shown in dashed lines).

An overload is detected by overload circuit 36 when the integrated value (i.e., an average voltage across the FET over time) exceeds a predetermined threshold. Upon detecting an overload, the overload circuit 36 outputs a signal to the gate drive circuit 24 and a feedback diagnostic circuit 38. The signal from the overload circuit 36 causes the gate drive circuit 24 to turn OFF the conducting FET 26A or 26B so as to reduce the ON-time, thus decreasing both the power dissipation and temperature of the FET into a safe operating region. When the feedback diagnostic circuit 38 receives the signal from the overload circuit 36, a feedback signal is generated and output to the microcontroller 22. Upon receiving the feedback signal, the microcontroller 22 sets a register such that a visual indication will be provided to the user that an overload condition has occurred. The visual indication may be provided to the user by flashing a light emitting diode (LED) 39 on a module contained within the load control circuit 10, or by having the output of the FET 26A or 26B cause the load 30 (e.g., lighting load 30) to cycle ON and OFF for a period of time, preferably when the load 30 is initially turned either ON or OFF. It is preferable to provide such a visual indication so that the user is aware that the output of the load control circuit (dimmer) has been reduced due to an overload rather than a malfunction of the dimmer, and so that corrective action may be taken. The microcontroller 22 can be programmed so that the visual indication continues to alert the user even after an overload has been removed. A reset actuator 40 can be added to the load control circuit 10' to return the system to a normal operating mode. The reset actuator 40 can be actuated by a factory trained representative after the system has be thoroughly checked out.

It is preferable to prioritize the signals from the short circuit protection circuit 32, the overload circuit 36, and the microcontroller 22 that are received by the gate drive circuit 24. The highest priority is given to the short circuit protection circuit 32 for the reasons noted above with regard to FIG. 1. Although the slower reacting overload circuit 36 protects against overcurrent and over-temperature conditions, the short circuit protection circuit 32 is needed to respond instantly to remove current from the FET if the ON-state voltage exceeds a safe operating point. The signal sent by the overload circuit 36 to the gate drive circuit 24 to turn OFF the FETs has a secondary priority to control the FETs. A lower priority is given to the microcontroller 22 gate drive signal, which serves to control the FETs when no faults are detected. Thus, the combination of the overload circuit 36 and the short circuit protection circuit 32 provides a wide range of protection in all operating environments.

As noted above, an overcurrent condition is detected by overload circuit 36 when the integrated value of the voltage across the FET exceeds a predetermined threshold. This average voltage-based determination is made based on the following relationships. The power dissipation of the FET may be determined by the relationship:

$$P = V^2/R = I^2 * R$$

wherein V is the ON-state voltage across the FET, R is the ON-state resistance $R_{DS\ ON}$ of the FET, and I is the load current $I_L$. While $R_{DS\ ON}$ is a known parameter that is determined by the intrinsic characteristics of the FET, determining the $V^2$ and $I^2$ terms requires complicated circuitry.

The present invention advantageously eliminates the need to utilize complicated circuitry to determine the squared terms to calculate the power dissipation of the FET. In accordance with the present invention, the power dissipation of the FET ($P_{AVG}$) is determined by comparing the average voltage $V_{AVG}$ across the FET to a variable threshold $V_{TH\ (VAR)}$ determined based on the ON-state resistance $R_{DS\ ON}$ of the FET and maximum power dissipation of the controllably conductive device. The variable threshold $V_{TH\ (VAR)}$ also accounts for the $V^2$ term in determining power dissipated, therefore, the power dissipation of the FET may be determined quickly using less complicated circuitry.

Figure 7:
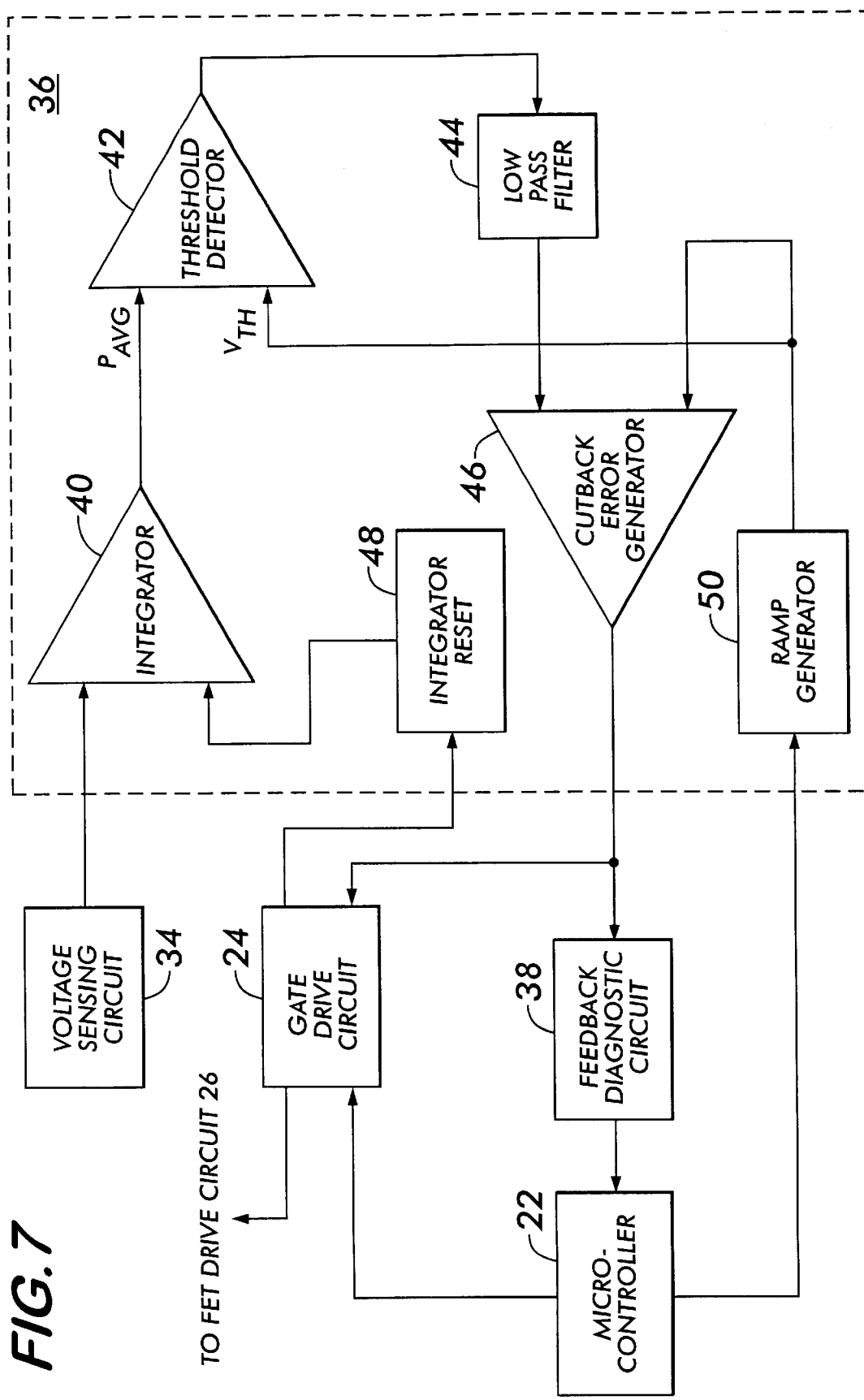
FIG. 7 is a block diagram of the overload circuit of FIG. 2.
Figure 8A:
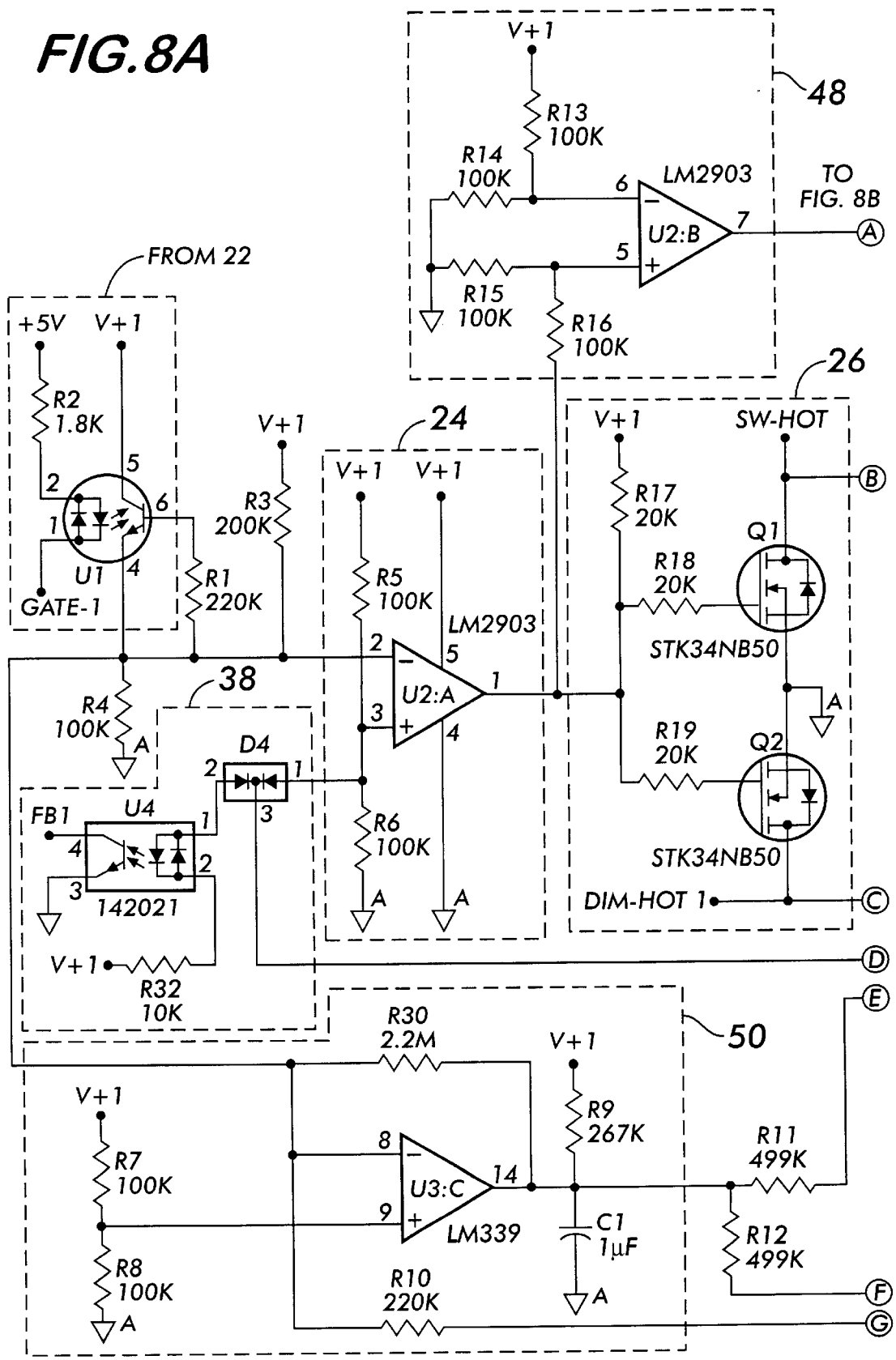
FIG. 8 is a schematic diagram of the overload circuit of FIG. 7.
Figure 8B:
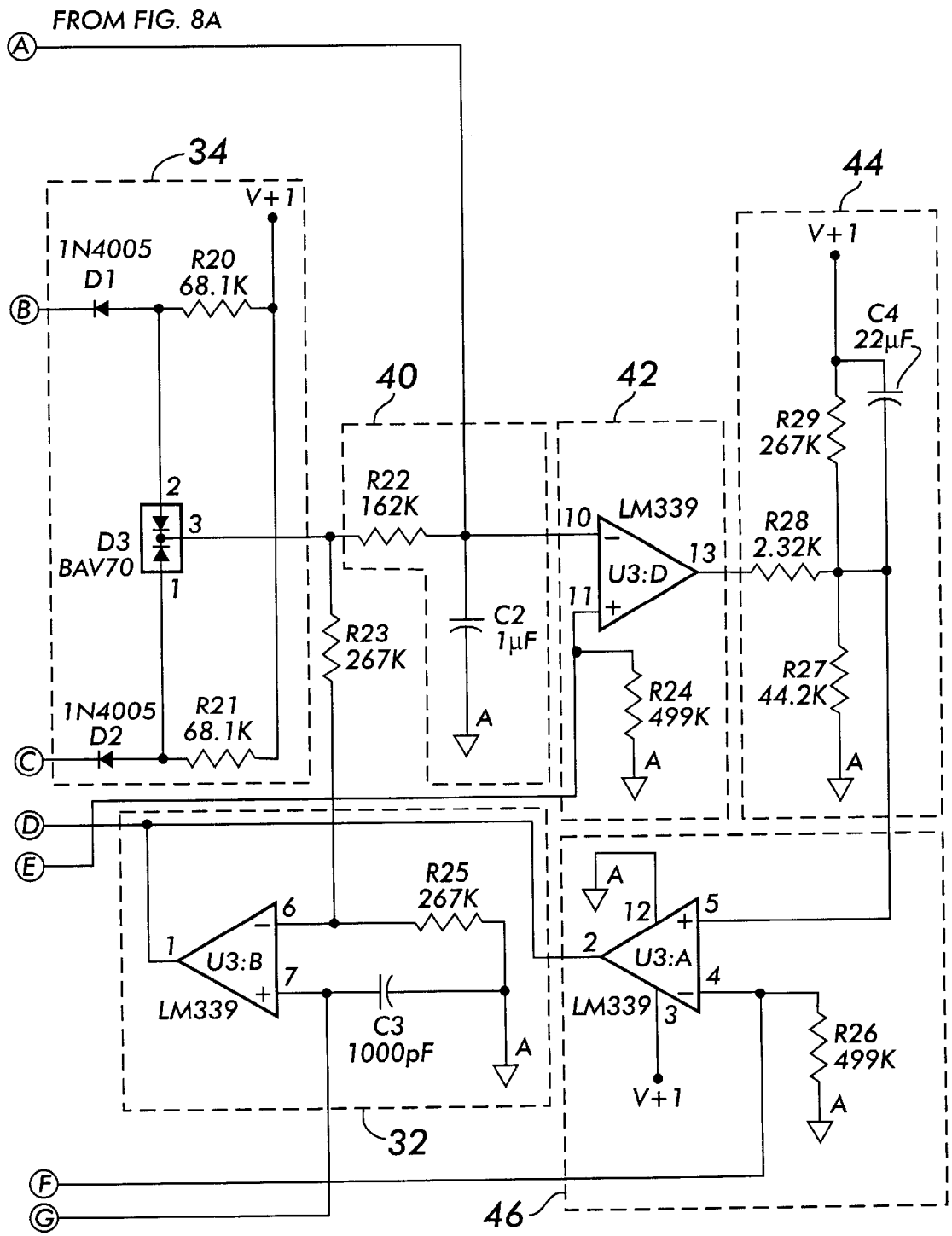

The variable threshold $V_{TH(VAR)}$ of the present invention and its relationship to average power $P_{AVG}$, load current $I_L$, and average voltage $V_{AVG}$ across the FET over a half-cycle will now be described with reference to FIGS. 3–6. Circuitry to implement the relationships is illustrated in FIGS. 7 and 8, and will be described in detail below. As noted above, the variable threshold $V_{TH(VAR)}$ of the present invention is determined based on the ON-state resistance $R_{DS\ ON}$ of the FET, and in addition, the maximum power dissipation allowed to maintain safe device operation for the thermal system being used. Therefore, the variable threshold $V_{TH\ (VAR)}$ can be advantageously "tuned" to a particular FET within the control circuit 10' for all combinations of conduction time, overload currents and temperatures. In the preferred embodiment, the FET is capable of dissipating 16 Watts in a maximum ambient temperature of 40° C. The load control circuit 10' of the preferred embodiment is rated at 10 A with the overload circuit 36 starting to cut back the ON-time of the FET 26A/26B at around a load current $I_L$ of 11.3 A.

Figure 3:
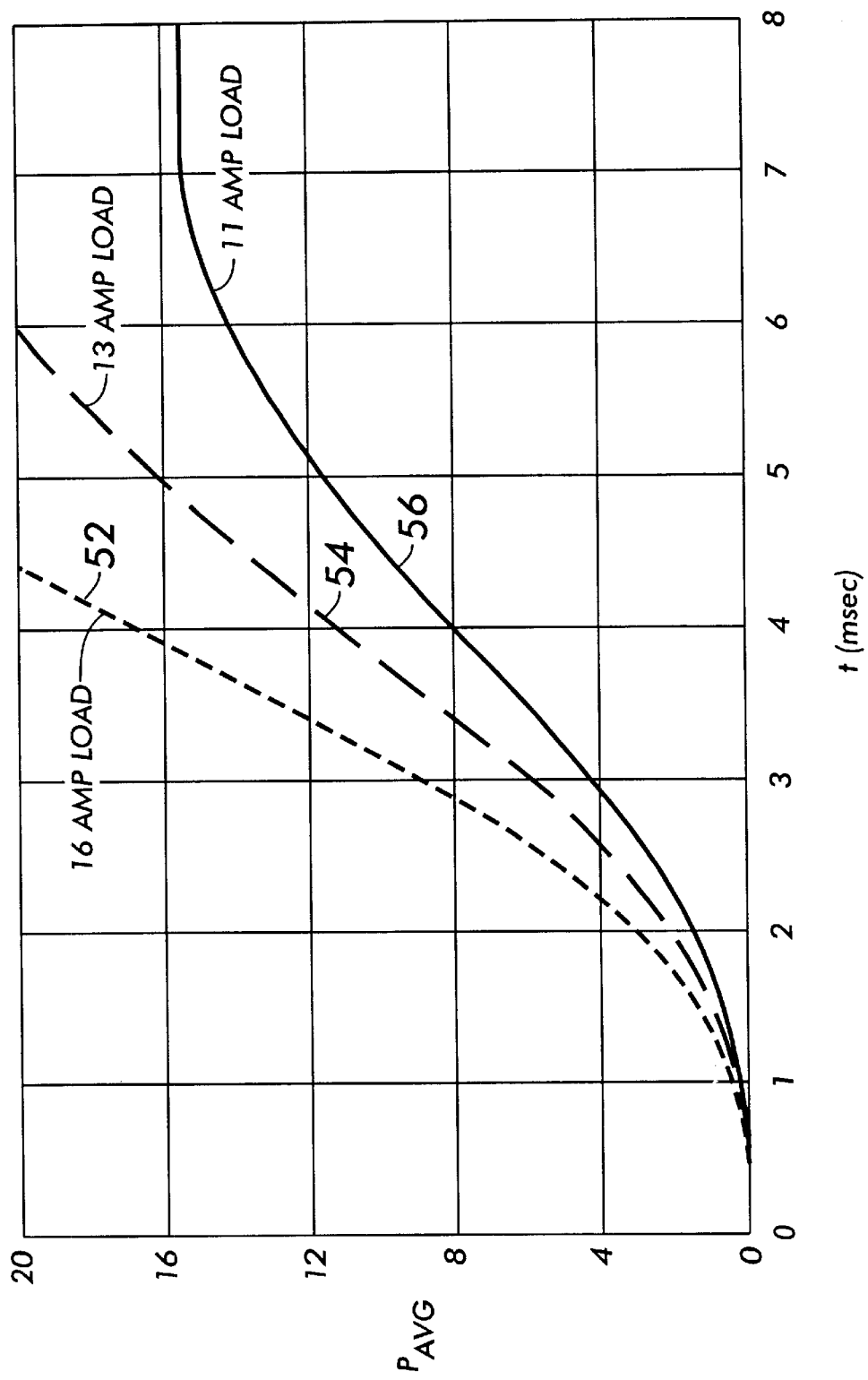
FIG. 3 is a graphical illustration of average power $P_{AVG}$ dissipated by a controllably conductive device versus time for various load currents $I_L$.

Lines 52, 54 and 56, respectively, of FIG. 3 illustrates the relationship of power dissipation $P_{AVG}$ versus time t for load currents $I_L$ of 16 A, 13 A and 11 A over a half-cycle at a fixed ambient temperature (40° C). A half-cycle of a 60 Hz AC signal has a duration of approximately 8.333 msec. As illustrated by the relationship of FIG. 3, if, for example, it is desired to limit maximum power dissipation of the FET to 16 Watts, then the FET must be turned OFF 4 msec into the half-cycle for a load current $I_L$ of 16 A, and turned OFF 5 msec into the half-cycle for a load current $I_L$ of 13 A. A load current $I_L$ of 11 A does not exceed a power dissipation of 16 W under the conditions presented.

Figure 4:
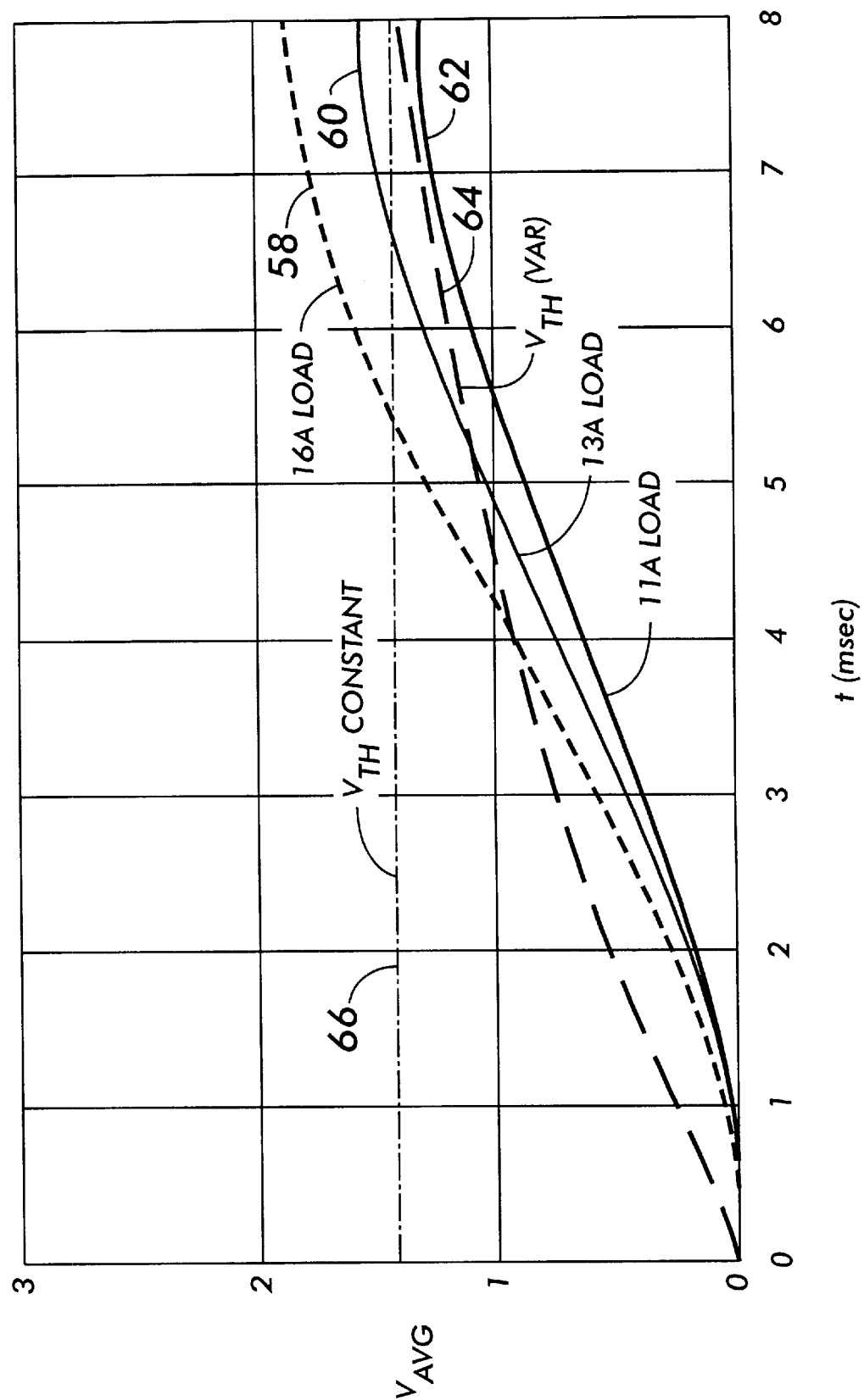
FIG. 4 is a graphical illustration of the average voltage $V_{AVG}$ across a controllably conductive device versus time for various load currents. Also illustrated are a variable threshold and fixed threshold.

Referring now to FIG. 4, there is illustrated the relationship of average voltage ($V_{AVG}$) across the FET versus time, a variable threshold $V_{TH(VAR)}$, and a fixed threshold $V_{TH\ (CONSTANT)}$. The average voltage $V_{AVG}$ across the FET versus time for load currents $I_L$ of 16, 13 and 11 A is illustrated by lines 58, 60 and 62, respectively and the variable threshold $V_{TH(VAR)}$ is indicated by line 64. The fixed threshold $V_{TH\ (CONSTANT)}$ is indicated by line 66. The variable threshold $V_{TH(VAR)}$ 64 is empirically derived so as to limit the maximum power dissipation to a fixed level (e.g., 16 W).

As noted above, the present invention compares the average voltage ($V_{AVG}$) across the FET to the variable threshold to determine if the FET is dissipating too much power, and thus is overloaded. This feature is illustrated in FIG. 4, wherein line 64, representing the variable threshold $V_{TH(VAR)}$, intersects line 58, representing a load current $I_L$ of 16 A, at approximately 4 msec into the half-cycle. As noted with respect to FIG. 3, in order to limit maximum power dissipation of the FET to 16 W, the FET must be turned OFF 4 msec into the half-cycle for a load current $I_L$ of 16 A. Likewise, the variable threshold $V_{TH(VAR)}$ intersects line 60, representing an $I_L$ of 13 A, at approximately 5 msec into the half-cycle. Again, as noted with respect to FIG. 3, in order to limit maximum power dissipation of the FET to 16 W, the FET must be turned OFF 5 msec into the half-cycle a load current $I_L$, of 13 A. Finally, the variable threshold $V_{TH(VAR)}$ (line 64) does not intersect line 62, which represents an $I_L$ of 11 A.

Therefore, as illustrated in FIG. 4, by comparing an average voltage across the FET to a variable threshold, a determination of power dissipation over a range of load currents can be made to limit a maximum power dissipation of the FET and provide superior overload protection. Further, as is evident from FIG. 4, the fixed threshold (line 66) will not provide adequate overload protection over a wide range of load currents. If the value of $V_{TH(CONSTANT)}$ is set to allow a 10 A current to flow, then for example, if the FET is conducting a load current $I_L$ of 16 A, the FET will not be turned OFF until 5.5 msec into the half-cycle. Referring to FIG. 3, at 5.5 msec into the half-cycle, the FET will be dissipating well in excess of 20 W. Thus, the fixed threshold will not provide a sufficiently low threshold early in the half-cycle to prevent an overload in the FET.

Figure 5:
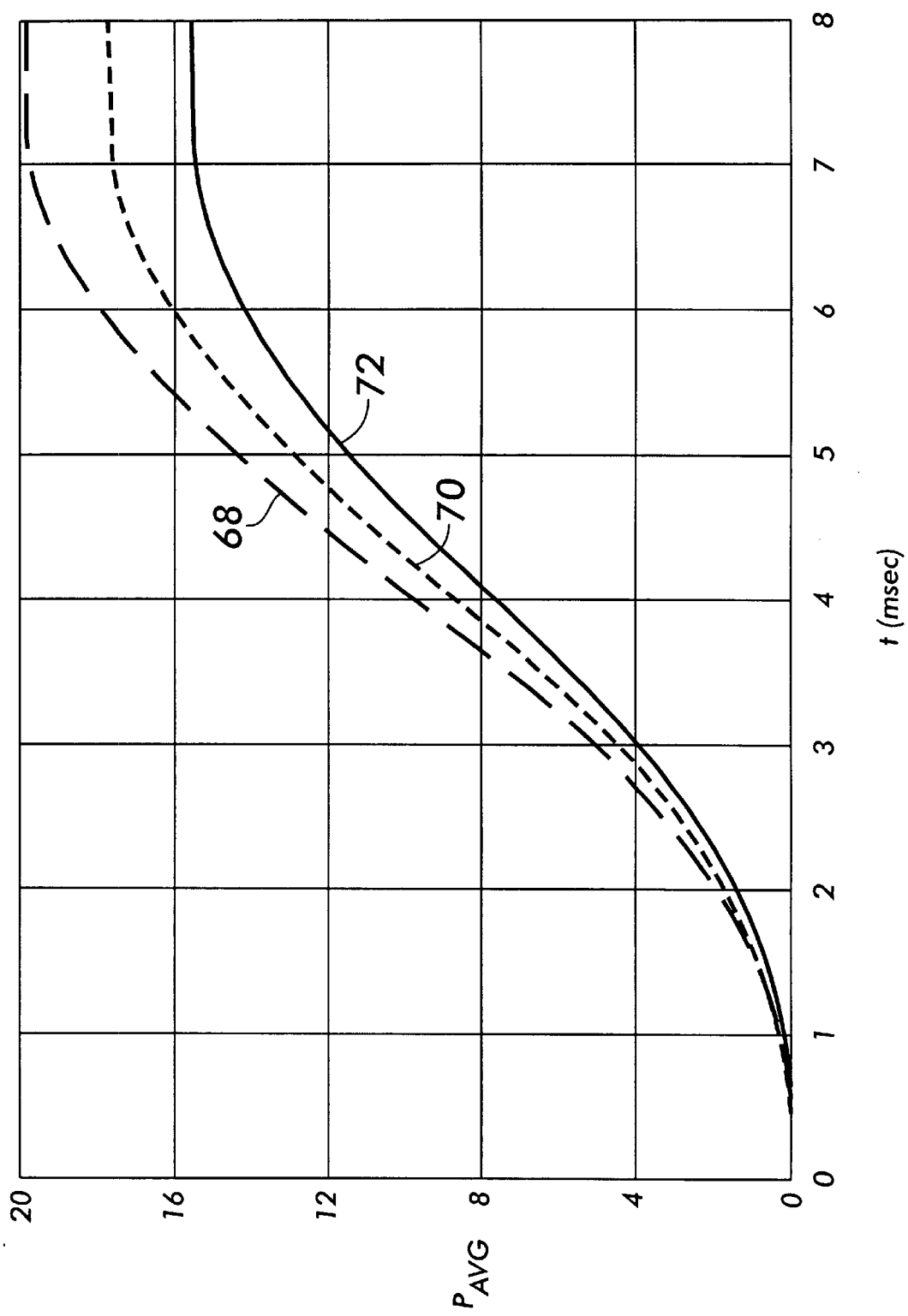
FIG. 5 is a graphical illustration of average power $P_{AVG}$ dissipated by a controllably conductive device versus time for a controllably conductive device operating at various temperatures and having a constant load current $I_L$.

FIG. 5 illustrates how the temperature dependencies of the ON-state resistance $R_{DS\ ON}$ of the FET may affect power dissipation. For example, in the present invention, the preferred FET is an STY34NB50, manufactured by SGS Thompson. The ON-state resistance of that FET at 25° C. is approximately 0.11 to 0.13 Ohms when the load current $I_L$ is 17 Amps. At 130° C., the ON-state resistance of the FET is 2.25 times greater than at 25° C., or 0.25 to 0.29 Ohms. It is noted that to ensure a safe operating range, it is preferable to use the worst case ON-state resistance of 0.29 Ohms as the value of $R_{DS\ ON}$.

Lines 68, 70 and 72 in the graph of FIG. 5 represent a load current $I_L$ of 11 A at temperatures of 140° C., 120° C. and 100°C., respectively. If, for example, it is desired to limit maximum power ($P_{AVG}$) dissipation of the FET to 16 W, then the FET must be turned OFF at approximately 5.3 msec into the half-cycle when operating at a temperature of 140° C., and turned OFF at approximately 6 msec into the half-cycle when operating at a temperature of 120° C. An operating temperature of 100°C. would not exceed a power dissipation of 16 W with a load current of 11 A in the present example.

Figure 6:
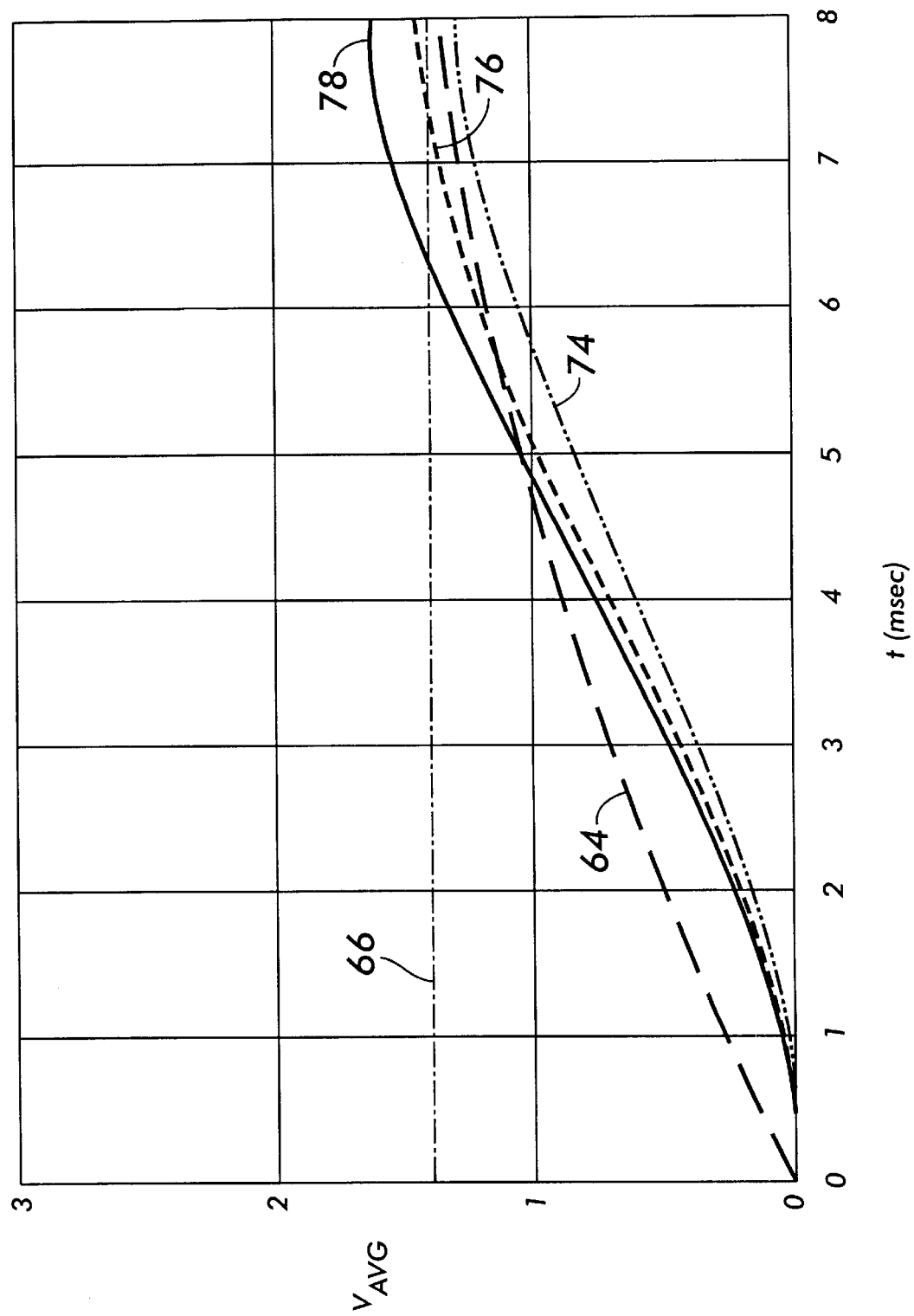
FIG. 6 is a graphical illustration of the average voltage $V_{AVG}$ across a controllably conductive device verus time at various operating temperatures while controlling a constant load current. Also illustrated are a variable threshold and fixed threshold.

FIG. 6 illustrates the relationship of average voltage across the FET ($V_{AVG}$) versus time t. Lines 78, 76 and 74, respectively illustrate the average voltage $V_{AVG}$ across the FET for a load current $I_L$ 11 A at operating temperatures of 140° C., 120° C. and 100° C., respectively. Line 64 represents the variable threshold $V_{TH(VAR)}$, and line 66 represents the fixed threshold $V_{TH(CONSTANT)}$.

The variable threshold $V_{TH(VAR)}$ feature of the present invention may also be used to limit power dissipation of the FET by accounting for the temperature dependencies of $R_{DS\ ON}$. This feature is illustrated in FIG. 6, wherein line 64, representing the variable threshold $V_{TH(VAR)}$ intersects line 78, representing an operating temperature of 140° C., at approximately 4.75 msec into the half-cycle. As noted with respect to FIG. 5, to limit maximum power dissipation to 16 W, the FET must be turned OFF at approximately 5.3 msec into the half-cycle for an operating temperature of 140° C. As can be seen, if the same variable threshold $V_{TH(VAR)}$ is used to check for an elevated ambient, the system will slightly over correct. This is because the contribution of ON-state resistance $R_{DS\ ON}$ to power is not squared, therefore over correction of the cutback time results. This allows the FET 26A/26B to cool and ultimately settle to a higher ON-time than is shown in FIG. 6. In the example shown, the load control circuit will start to cutback the ON-time to approximately 4.75 msec instead of 5.3 msec. The load control circuit will settle at a value between these two times because as the power is cut back by reducing the "on" time, the device will run cooler because both the $I_L$ and the ON-state resistance $R_{DS\ ON}$ will decrease. Similarly, the variable threshold $V_{TH(VAR)}$ intersects line 76, representing an operating temperature of 120° C., at approximately 5.3 msec into the half-cycle. Again, as noted with respect to FIG. 5, to limit maximum power dissipation to 16 W, the FET must be turned OFF at approximately 6 msec into the half-cycle for an operating temperature of 120° C. Finally, the variable threshold does not intersect line 74, which represents a temperature of 100° C.

Therefore, the variable threshold of the present invention may be used to account for a wide range of operating temperatures and variations in load current $I_L$ to accurately limit maximum power dissipation the FET. As shown in FIG. 6, a fixed threshold (line 66) will not provide adequate protection against thermal effects. For example, a FET operating at 140° C. will not be turned OFF until 6.3 msec into the half-cycle, which translates to a power dissipation of approximately 18 W. Thus, the fixed threshold will not provide a sufficiently low threshold early in the half-cycle to prevent an overload in the FET.

As illustrated by FIGS. 3–6, a comparison of an average voltage across the FET to a variable threshold, as determined in accordance with the present invention, prevents overloads over a wide range of operating conditions.

An exemplary overload circuit 36 implementing the relationships described in FIGS. 3–6 will now be described in greater detail with reference to FIGS. 7 and 8. FIG. 7 illustrates a block diagram of the overload circuit 36, whereas FIG. 8 illustrates a schematic diagram of the presently preferred embodiment. As illustrated, the overload circuit 36 includes an integrator 40, an integrator reset 48, a threshold detector 42, a low pass filter 44, a cutback error generator 46, and a ramp generator 50.

The integrator circuit 40 receives the output of the voltage sensing circuit 34, which as noted-above, provides an indication of the instantaneous ON-state voltage of the FET 26A or 26B. The integrator 40 determines the average voltage $V_{AVG}$ across the FET. The average voltage is proportional to the Volt-Seconds that build-up across the FET in its ON-state during a half-cycle of the AC waveform. The $V_{AVG}$ output of the integrator 40 is variable and will vary with FET temperature, ON-state resistance $R_{DS\ ON}$, and the load current.

The integrator 40 output is reset at the beginning of each AC half-cycle by an integrator reset 48 to ensure that only the present half-cycle information is being measured. The microcontroller 22 provides the reset pulse via the gate drive circuit 24 to clear the integrator 40 based on an output of the zero cross detection circuit 16. Alternatively, a signal may be sent directly from the zero cross detection circuit 16 to the integrator reset 48. The integrator reset 48 functions to hold off (reset) the integrator 40 during the period of time that the FETs are OFF. It is preferable to reset the integrator 40 because the OFF-state voltage of the FET is very large compared to the ON-state voltage, and in order to monitor a relatively low ON-state voltage of the FET, the OFF-state information should be removed from the integrator 40. Further, the OFF-state voltage is not useful in determining an overload condition of the FET.

The threshold detector 42 compares the output of the integrator 40 ($V_{AVG}$) to the variable threshold $V_{TH(VAR)}$ in order to provide an indication that the FET is overloaded by dissipating too much power, conducting too high a load current $I_L$, or if the FET is reaching an unsafe operating temperature. As noted above, the variable threshold $V_{TH(VAR)}$ is empirically determined as described above.

A ramp generator 50 is provided to generate the variable threshold $V_{TH(VAR)}$ in accordance with the above. The variable threshold, as describe above, is a ramping value and is used to reduce the ON-time of the FET to maintain a constant maximum power dissipation in the FET over a wide range of overload conditions. That is, the slope and amplitude of the ramp generator is chosen to maintain the desired constant power dissipation in the FET for all combinations of conduction times, overload currents, and elevated ambient conditions. The ramp generator 50 provides the ramping waveforms to both threshold detector 42 and an cutback error generator 46 (described below). The ramping waveform is reset at the AC source zero crossing, as indicated by the microcontroller 22. In a preferred embodiment, the ideal variable threshold $V_{TH(VAR)}$ is approximated by an RC circuit to be described below.

The output of the threshold detector 42 is filtered by a low pass filter 44 having a long time constant (e.g., greater than one second) to provide a measure of additional stability in the operation of the load control circuit 10'. The low pass filtering provides hysteresis to help prevent the cutback error generator 46 from causing an over-correction, which could cause visible fluctuations in the light output from the load. To help prevent over-correction, the low pass filter 44 smooths the output from the threshold detector 42. The time constant of the low pass filter is preferably approximately 1–2 sec. This time constant is short enough to prevent the FET from reaching unsafe temperatures during overloads before the conduction time is reduced. However, this slow response makes the overload circuit 36 ineffective in providing a quick shutdown during a large overload or short circuit. Because of this hysteresis the short circuit protection circuit 32 is used in addition to the overload circuit to provide complete protection.

The cutback error generator 46 receives the filtered signal from the low pass filter 44 and compares the filtered signal value to another ramping signal from the ramp generator 50 which is reset at each AC line voltage zero crossing. The ramping signal is used to determine how much the FET conduction time (ON-time) is reduced for a particular amount of Volt-Seconds measured across the FET by the integrator 40. The cutback error generator output is derived from the intersection of the level of heavily filtered DC voltage from the low pass filter 44 with the ramp to generate the proper "cutback" signal. The "cutback" signal ensures the FET ON-time will be the correct value to limit the FET power to 16 W. The output of the cutback error generator 46 is a square wave which is provided to the gate drive circuit 24 to shut OFF the FETs during a half-cycle if an overload condition occurs. The output is also provided to the feedback diagnostic circuit 38 so information may be provided to the microcontroller 22 that the FET ON-time has been "cutback" from the ON-time being called for by the microcontroller 22 based on user input. The microcontroller 22 can then optionally indicate the overload or over-temperature to the user.

Referring now to FIG. 8, there is illustrated an exemplary schematic diagram that corresponds to the functional blocks shown in FIG. 7. The voltage across the FETs 26A/26B (Q1/Q2) measured by the voltage sensing circuit 34 is input to the integrator 40 by having the voltage on R21 and R20 pulled low during the FET on time. When the FET is off the diodes (D1 and D2) are reversed biased and the voltage is held at 12 V by the supply 18. This ensures the input the integrator 40 will not be over driven above the supply when the FETs are OFF.

The integrator 40 consists of R22 and C2, which provide a time constant that allows the capacitor to charge to a level near 1Volt through the half cycle with the FET carrying 10 A of load current. The capacitor is reset to zero volts whenever the gate drive to the FETs is pulled low. This is accomplished by the input of the comparator being pulled below a threshold level half way between the supply rail and common.

The threshold detector 42 receives the voltage from the integrator capacitor C2 and compares it to a ramp function from the ramp generator 50. The output of this comparator goes low whenever the integrated voltage exceeds the ramp. The output will stay low until the capacitor is reset as described above.

The FET gate drive circuit 24 must not change immediately when the integrator 40 exceeds the ramp because the amount of reduction of the FET conduction time will cause the FET to cool and lower the integrator voltage further. The result of this is an over correction and the output voltage to the load will fluctuate. To avoid this a low pass filter 44 is used average the error from the threshold detector 42 over several seconds. This allows the FET temperature to adjust gradually and find a stable operating point without fluctuations in the load. Resistors R29 and R27 set up a divider ratio that determines the non-trip output voltage of the low pass filter 44. Resistor R28 determines the voltage change when an overcurrent condition occurs. Capacitor C4 is chosen to give the proper time constant, again which is approximately 2 seconds.

The cutback error generator 46 compares the filtered DC output from low pass filter 44 to the same or another ramp function generated by the ramp generator 50. This is needed to create a low going pulse to turn OFF the FETs 26A/26B at an earlier point in the half cycle. The ramp is synchronized to the AC source 12 and is scaled by resistors R12 and R25. The slope of the ramp is chosen to yield a sufficient amount of cutback to the FET conduction time to keep the power dissipated in the FET below the maximum power dissipation of the FET (16 W in this application).

The ramp generator 50 uses the output of the microcontroller 22 that switches from a high to a low level at the AC line zero crossing. This output is compared against a reference of half the supply created by resistors R7 and R8. As long as the microcontroller 22 is providing a signal for the FET 26A or 26B to be ON the output of the comparator remains an open-collector output. During this time capacitor C1 is charged through resistor R9 at a time constant which gives a predetermined shape. At the end of each half cycle Op Amp U3C causes capacitor C1 to discharge. This shape allows the combination of the threshold detector 42 and the cutback error generator 46 to remove the gate drive to the FET at a time that will limit the power dissipation in the FET to 16 W. The capacitor C1 and resistor R9 are chosen so that the shape of the ramp generated approximates that determined empirically as shown in FIG. 3 and FIG. 4.

The short circuit protection circuit 32 monitors at the instantaneous voltage across the FETs 26A/26B through the divider ratio created by resistors R23 and R25. This compared to a reference level of approximately ⅓ of the supply voltage generated by a divider set up by resistors R3 and R4 whenever the microcontroller 22 drives the FETs 26A/26B ON. A small delay is added to the reference level through resistor R10 and capacitor C3 to ensure the FET voltage has had time to collapse once gate drive appears. At any point after the FETs 26A/26B have been turned ON, if the FET voltage exceeds the threshold the gate drive will be removed instantly.

The gate drive circuit 24 combines three signals to determine whether the FET gates should be turned ON or OFF. The microcontroller 22 has the lowest priority. A signal from either the short circuit protection 32 or the cutback error generator 46 that pulls low earliest in the half cycle will force the FET gate OFF at that point. Normally resistors R5 and R6 hold the voltage to a level of half the supply. When either fault occurs the level will be pulled to common.

The feedback diagnostic circuit 38 sends a signal to the microcontroller 22 through an optocoupler U4 whenever the output from the short circuit protection circuit 32 or the cutback error generator 46 pulls low. The current through resistor R32 drives the optocoupler LED in this case.

As fully described above, the present invention provides a load control circuit having a novel overload circuit that can be implemented using simple circuitry. The present invention may be embodied in on other specific forms without departing from the spirit or essential attributes thereof, and accordingly, reference should be made to the appended claims, rather than to the foregoing specification, as indicating the scope of the invention.

What is claimed is:

1. A protection circuit for use in a load control system for limiting power dissipated by an electronic component, said electronic component switching an AC source to a load, said protection circuit comprising:

an integrating circuit which integrates a measured parameter of said electronic component over a predetermined period of time and produces an output value;

a threshold generating circuit which generates a first threshold indicative of a maximum average power dissipation of said electronic component;

a comparator circuit which compares said first threshold and said output value, and provides a signal to turn OFF said electronic component when said output value exceeds said first threshold, a reset circuit, wherein said reset circuit holds said integrated circuit OFF during a period of time said electronic component is normally OFF; and a filtering circuit that receives said signal from said comparator circuit, said filtering circuit smooths said signal from said comparator circuit.

2. The protection circuit as recited in claim 1, wherein said first threshold is determined in accordance with a resistance of said electronic component when said electronic component is ON and said maximum average power dissipation of said electrical component.

3. The protection circuit as recited in claim 1, wherein said first threshold is approximated by an RC circuit.

4. The protection circuit as recited in claim 1, further comprising an error generating circuit that receives an output of said filtering circuit and compares said output of said filtering circuit to a second threshold, wherein said error generating circuit turns OFF said electronic component, based on said second threshold.

5. The protection circuit as recited in claim 4, wherein said second threshold varies in accordance with an ON-state resistance of said electronic component and said maximum average power dissipation of said electronic component.

6. The protection circuit as recited in claim 4, wherein said second threshold is identical to said first threshold.

7. The protection circuit as recited in claim 1, wherein said first threshold has a variable value that changes during one-half of a period of a fundamental frequency of said AC source.

8. The protection circuit as recited in claim 1, wherein said predetermined period of time begins when said a waveform of said AC source crosses a zero potential, and wherein said predetermined period of time has a length no longer than one-half of a period of a fundamental frequency of said waveform of said AC source.

9. The protection circuit as recited in claim 1, wherein said electronic component is a field effect transistor (FET) and said measured parameter is a selected one of a voltage across said FET, a current through said FET, and a temperature of said FET.

10. A load control system for delivering power from an AC source to a load, said AC source having a fundamental frequency, said load control system comprising:

a zero cross detector that monitors said AC source;

at least one switching element that selectively connects said AC source to said load;

a sensing circuit that senses an instantaneous ON-state parameter of said at least one switching element and produces an output;

an overload circuit that receives said output and determines an integrated value of said ON-state parameter and compares said integrated value to a threshold indicative of a maximum average power dissipation of said at least one switching element to determine if said at least one switching element is in an overload condition, wherein said overload circuit comprises:

an integrating circuit which integrates said ON-state parameter of said at least one switching element over a predetermined period of time that is synchronized to a zero crossing of said fundamental frequency, said integrating circuit outputting an integrated value of said ON-state parameter;

a threshold generating circuit which generates a first threshold that varies in accordance with a resistance of said switching element when said switching element is ON and said ON-state parameter; and a comparator circuit which compares said first threshold and said integrated value and turns OFF said switching element when said integrated value exceeds said first threshold;

a short circuit protection circuit that also receives said output to determine if said load is short circuited; and a controller that controls said load control system, said controller receiving information from said zero cross detector and outputting a gate drive signal to turn said at least one switching element ON, wherein said overload protection circuit reduces the ON time of said at least one switching element when said at least one switching element is determined to be overloaded and said short circuit protection circuit reduces the ON time of said at least one switching element when said load is determined to be shorted circuited.

11. The load control system as recited in claim 10, wherein said zero cross detector comprises a filter to reduce unwanted noise from said AC source.

12. The load control system as recited in claim 11, wherein said filter introduces a phase shift in said zero cross detection circuit and said phase shift is subtracted from an output of said zero cross detector.

13. The load control system as recited in claim 10, further comprising a power supply, wherein said power supply is connected to said AC source and outputs a regulated voltage to said controller.

14. The load control system as recited in claim 10, further comprising a gate drive circuit that receives an output of said overload circuit and said short circuit protection circuit, wherein said gate drive circuit turns said at least one switching element ON and OFF.

15. The load control system as recited in claim 14, wherein said gate drive circuit turns OFF said at least one switching element based on a predetermined prioritization, wherein said short circuit protection circuit has priority over said overload circuit, and said overload circuit has priority over said controller to turn OFF said at least one switching element.

16. The load control system as recited in claim 10, wherein said overload circuit includes a reset circuit to prevent said determination of said integrated value when said at least one switching element is OFF.

17. The load control system as recited in claim 10, further comprising a reset circuit synchronized to said fundamental frequency, wherein said reset circuit holds OFF said integrating circuit during a period of time that said at least one switching element is normally OFF.

18. The load control system as recited in claim 17, further comprising a filtering circuit that receives an output of said comparator circuit, wherein said filtering circuit smooths said output from said comparator.

19. The load control system as recited in claim 18, further comprising an error generating circuit that receives an output of said filtering circuit and compares said output of said filtering circuit to a second threshold that varies in accordance with said ON-state parameter and said maximum average power dissipation of said at least one switching element.

20. The protection circuit as recited in claim 19, wherein said second threshold is identical to said first threshold.

21. The load control system as recited in claim 10, wherein said at least one switching element is a field effect transistor (FET) and said ON-state parameter is a selected one of a voltage across said FET, a current through said FET, and a temperature of said FET.

22. The load control system as recited in claim 10, wherein said load comprises a capacitive load.

23. The load control system as recited in claim 10, wherein said load comprises a lighting load, and said overload conditions are visually indicated to a user by flashing said lighting load.

24. The load control system as recited in claim 23, wherein said controller sets an ON-time of said at least one switching element to a constant duty cycle for a given intensity level of said lighting load set by a user.

25. A method of protecting a switching element connected between an AC source and a load from dissipating power in excess of a predetermined amount comprising:

measuring a parameter of the switching element;

integrating the measured parameter over a predetermined time period to produce an output;

comparing the output to a variable threshold;

producing a signal when the output exceeds the variable threshold;

holding said integrated circuit OFF during a period of time said electronic component is normally OFF;

filtering the output to produce a smoothed signal; and turning OFF the switching element in response to said smoothed signal.

26. The method as recited in claim 25, further comprising turning OFF the switching element when the parameter exceeds a second threshold value.

27. The method as recited in claim 25, wherein turning OFF the switching element comprises turning OFF the switching element at any point during one-half of a period of a fundamental frequency of said AC source when the switching element is ON.

28. The method as recited in claim 25, wherein the switching element comprises a field effect transistor (FET) and the parameter is a selected one of a voltage across said FET, a current through said FET, or a temperature of said FET.

29. The method as recited in claim 25, further comprising providing a visual indication to a user that the switching element has been overloaded.

30. The method as recited in claim 29, wherein said visual indication comprises cycling power to said load by turning OFF and ON the switching element.

* * * * *